(12) United States Patent
Miller et al.

(10) Patent No.: US 11,031,734 B1
(45) Date of Patent: *Jun. 8, 2021

(54) MODULAR ELECTRICAL CONNECTOR WITH REDUCED CROSSTALK

(71) Applicant: TE Connectivity Services GmbH, Schaffhausen (CH)

(72) Inventors: Keith Edwin Miller, Manheim, PA (US); Kyle Gary Annis, Hummelstown, PA (US); Scott Eric Walton, Mount Joy, PA (US); Albert Tsang, Harrisburg, PA (US); Kevin Michael Thackston, York, PA (US)

(73) Assignee: TE Connectivity Services GmbH, Schaffhausen (CH)

( * ) Notice: Subject to any disclaimer, the term of this patent is extended or adjusted under 35 U.S.C. 154(b) by 0 days.

This patent is subject to a terminal disclaimer.

(21) Appl. No.: 16/830,351

(22) Filed: Mar. 26, 2020

(51) Int. Cl.

| | |
|---|---|
| H01R 4/66 | (2006.01) |
| H01R 13/6471 | (2011.01) |
| H01R 13/6587 | (2011.01) |
| H05K 1/02 | (2006.01) |
| H01R 12/72 | (2011.01) |
| H01R 13/514 | (2006.01) |
| H01R 13/6473 | (2011.01) |

(52) U.S. Cl.
CPC ....... *H01R 13/6471* (2013.01); *H01R 12/724* (2013.01); *H01R 13/514* (2013.01); *H01R 13/6473* (2013.01); *H01R 13/6587* (2013.01); *H05K 1/0218* (2013.01)

(58) Field of Classification Search
CPC .............. H01R 12/724; H01R 13/6471; H01R 13/514; H01R 13/6473; H01R 13/6587; H05K 1/0218
USPC ..................................................... 439/92–108
See application file for complete search history.

(56) References Cited

U.S. PATENT DOCUMENTS

| | | |
|---|---|---|
| 6,171,115 B1 | 1/2001 | Mickievicz et al. |
| 6,267,604 B1 | 7/2001 | Mickievicz et al. |
| 6,384,341 B1 | 5/2002 | Rothermel et al. |
| 6,488,549 B1 | 12/2002 | Weller et al. |
| 6,540,522 B2 | 4/2003 | Sipe |
| 6,582,250 B2 | 6/2003 | Taylor et al. |
| 6,638,110 B1 * | 10/2003 | Billman ............. H01R 13/6471 439/607.07 |
| 6,655,966 B2 | 12/2003 | Rothermel et al. |
| 6,663,426 B2 | 12/2003 | Hasircoglu et al. |
| 6,663,442 B1 | 12/2003 | Helster et al. |
| 6,676,450 B2 | 1/2004 | Schroll |

(Continued)

*Primary Examiner* — Khiem M Nguyen

(57) ABSTRACT

An electrical connector for use in an electrical connector system which controls cross talk and signal radiation. The electrical connector includes a housing having a plurality of modules. The modules have mating ends and mounting ends. Signal contacts are positioned in the modules. The signal contacts extend between the mating ends and the mounting ends and are arranged in pairs to carry differential signals. Ground contacts are positioned in the modules. The ground contacts extend between the mating ends and the mounting ends. Respective ground contacts of the ground contacts are positioned adjacent to respective signal contacts of the signal contacts. Ground plates are positioned in the modules. The ground plates extend between the mating ends and the mounting ends, the ground contacts are electrically connected to the ground plates.

20 Claims, 12 Drawing Sheets

(56) References Cited

U.S. PATENT DOCUMENTS

| | | |
|---|---|---|
| 6,705,895 B2 | 3/2004 | Hasircoglu |
| 6,808,399 B2 | 10/2004 | Rothermel et al. |
| 6,811,414 B1 | 11/2004 | Consoli et al. |
| 6,811,440 B1 | 11/2004 | Rothermel et al. |
| 6,824,391 B2 | 11/2004 | Mickievicz et al. |
| 6,890,214 B2 | 5/2005 | Brown et al. |
| 6,932,649 B1 | 8/2005 | Rothermel et al. |
| 6,945,810 B1 | 9/2005 | Morana et al. |
| 6,964,583 B2 | 11/2005 | D'Ambrosia et al. |
| 6,997,736 B2 | 2/2006 | Costello et al. |
| 7,044,794 B2 | 5/2006 | Consoli et al. |
| 7,175,445 B2 | 2/2007 | Consoli et al. |
| 8,840,431 B2 | 9/2014 | Nguyen et al. |
| 10,535,971 B2 | 1/2020 | Annis et al. |
| 10,833,455 B2 * | 11/2020 | Chang .................. H01R 13/405 |
| 10,840,649 B2 * | 11/2020 | Gailus ................ H01R 13/6461 |

\* cited by examiner

MODULAR ELECTRICAL CONNECTOR WITH REDUCED CROSSTALK

FIELD OF THE INVENTION

The present invention relates to a modular connector with reduced crosstalk. In particular, the invention relates to a modular connector with an overmolded shielding component to optimize impedance and reduce crosstalk.

BACKGROUND OF THE INVENTION

Due to the increasing complexity of electronic components, it is desirable to fit more components in less space on a circuit board or other substrate. Consequently, the spacing between electrical terminals within connectors has been reduced, while the number of electrical terminals housed in the connectors has increased, thereby increasing the need in the electrical arts for electrical connectors that are capable of handling higher and higher speeds and to do so with greater and greater pin densities. It is desirable for such connectors to have not only reasonably constant impedance levels, but also acceptable levels of impedance and cross-talk, as well as other acceptable electrical and mechanical characteristics. Therefore, there remains a need to provide appropriate shielding to preserve signal integrity and to minimize crosstalk as speeds of signals increase and the footprint of the connector maintains or increases density of signal pairs.

It would, therefore, be beneficial to provide a connector which reduces crosstalk between contact pairs. It would also be beneficial to reduce crosstalk in a backplane connector and in the footprint of the printed circuit board to which the connector is assembled.

SUMMARY OF THE INVENTION

An embodiment is directed to an electrical connector for use in an electrical connector system which controls cross talk and signal radiation. The electrical connector includes a housing having a plurality of modules. The modules have mating ends and mounting ends. Signal contacts are positioned in the modules. The signal contacts extend between the mating ends and the mounting ends and are arranged in pairs to carry differential signals. Ground contacts are positioned in the modules. The ground contacts extend between the mating ends and the mounting ends. Respective ground contacts are positioned adjacent to respective signal contacts. Ground plates are positioned in the modules. The ground plates extend between the mating ends and the mounting ends, the ground contacts are electrically connected to the ground plates.

An embodiment is directed to an electrical connector for use in an electrical connector system which controls cross talk and signal radiation. The electrical connector includes a housing having a plurality of modules, with the modules having mating ends and mounting ends. Signal contacts are positioned in the modules. The signal contacts extend between the mating ends and the mounting ends and are arranged in pairs to carry differential signals. Circuit board mounting sections of the signal contacts in a respective module of the modules are offset from the circuit board mounting sections of the signal contacts in a respective adjacent module of the modules. Ground contacts are positioned in the modules and extend between the mating ends and the mounting ends. Respective ground contacts are positioned adjacent to respective signal contacts. Ground plates are positioned in the modules and extend between the mating ends and the mounting ends. The ground contacts are electrically connected to the ground plates. The ground plates have jogged sections to properly position the ground plates relative to the signal contact. The ground plates have wavy configurations to pass between and along the pairs of the signal contacts. The ground plates have first sections and second sections, with the second sections being positioned in a different plane than the first sections. The second sections have protrusions which extend in a direction away from the first sections. The modules are overmolded over the ground plates.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
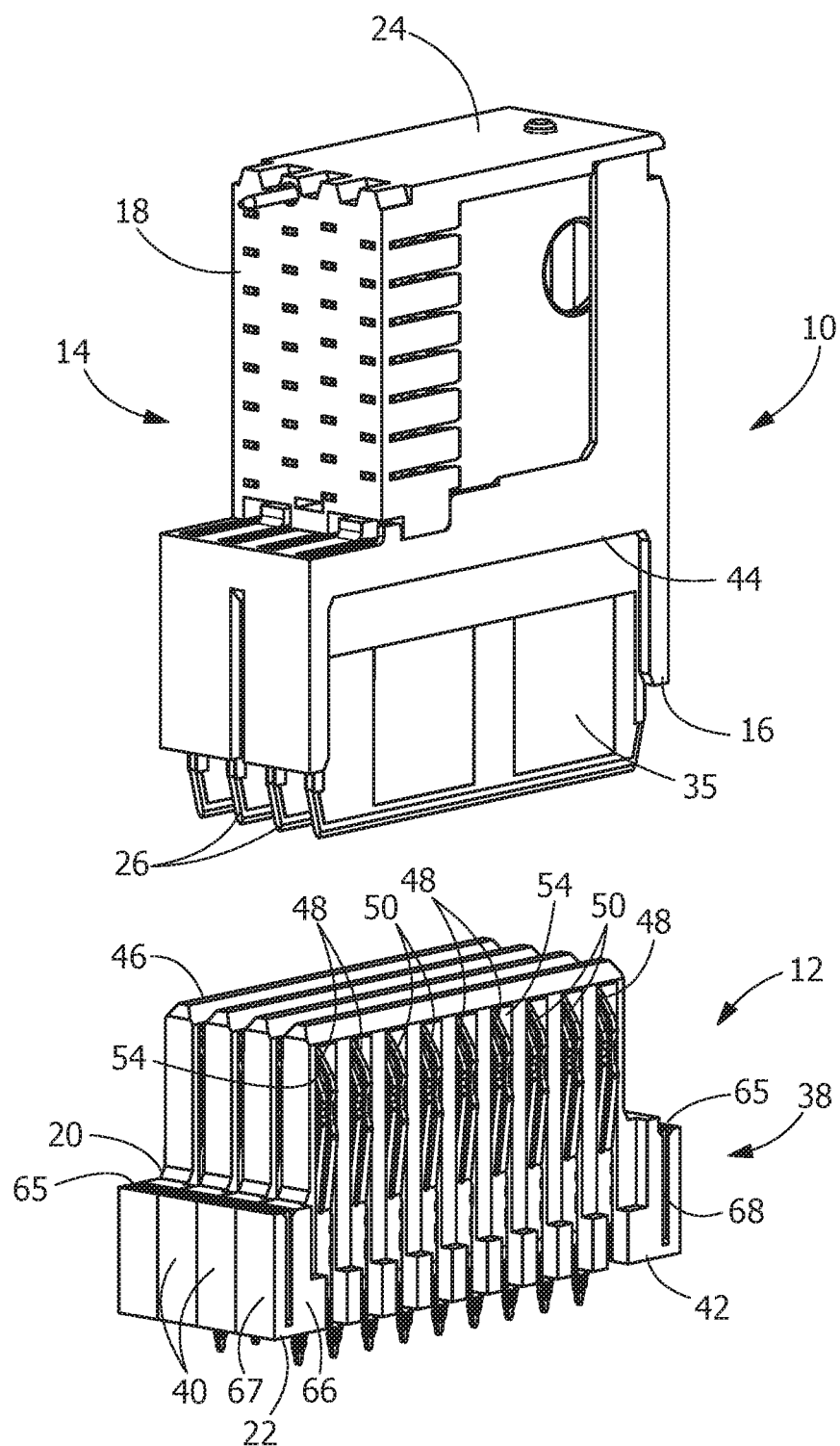
FIG. 1 is a front perspective view of an illustrative connector system shown in an unassembled position, with a backplane connector and a mating daughtercard connector positioned above the backplane connector prior to mating therewith.
Figure 2:
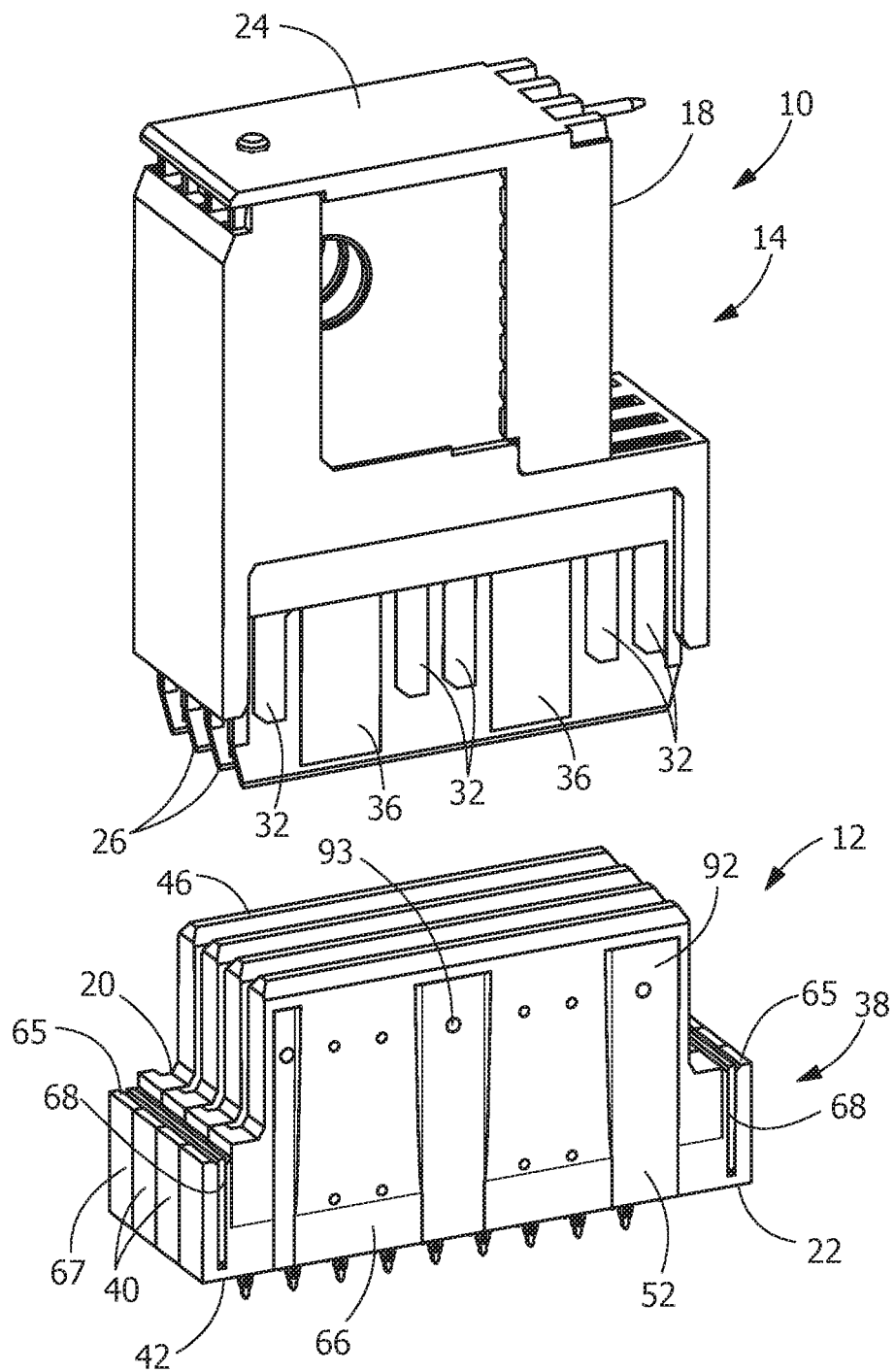
FIG. 2 is a back perspective view of a connector system of FIG. 1.
Figure 3:
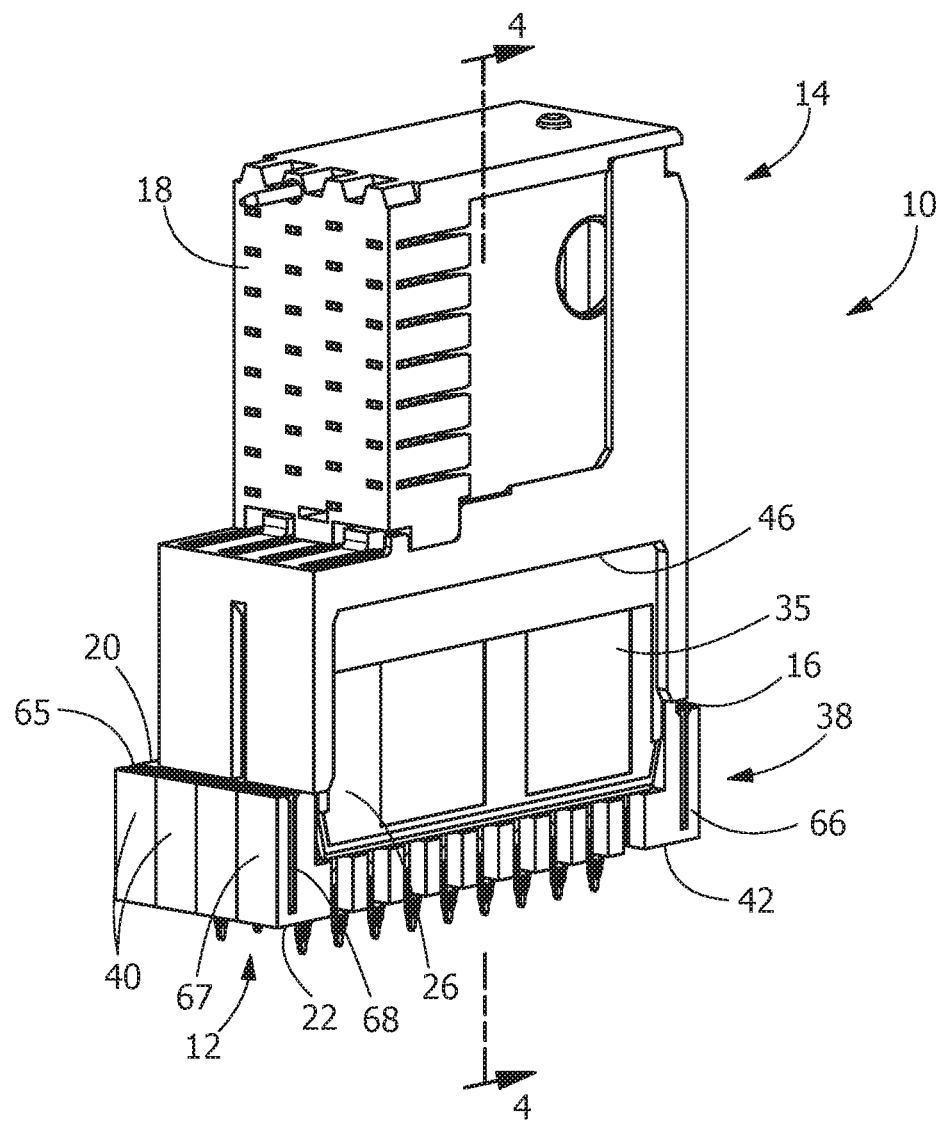
FIG. 3 is a perspective view of the backplane connector mated with the daughtercard connector.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

FIGS. 1 through 4 illustrate an electrical connector system 10 formed in accordance with an illustrative embodiment. The electrical connector system 10 includes a backplane connector 12 and a daughtercard connector 14 that are used to electrically connect a backplane circuit board (not shown) and a daughtercard circuit board (not shown). While the electrical connector system 10 is described herein with reference to backplane connectors 12 and daughtercard connectors 14, it is realized that the subject matter herein may be utilized with different types of electrical connectors other than a backplane connector or a daughtercard connector. The backplane connector 12 and the daughtercard connector 14 are merely illustrative of an electrical connector system 10 that interconnects a particular type of circuit board, namely a backplane circuit board, with a daughtercard circuit board.

In the illustrated embodiment, the backplane connector 12 constitutes a header connector mounted to the backplane circuit board. When the backplane connector 12 is mated to the daughtercard connector 14, the daughtercard circuit board is oriented generally perpendicular with respect to the backplane circuit board.

In the illustrative embodiment shown, the daughtercard connector 14 constitutes a right angle connector wherein a mating interface 16 and mounting interface 18 of the daughtercard connector 14 are oriented perpendicular to one another. The daughtercard connector 14 is mounted to the daughtercard circuit board at the mounting interface 18. Other orientations of the interfaces 16, 18 are possible in alternative embodiments.

The backplane connector 12 includes a mating end 46 and a mounting end 42 that are oriented generally parallel to one another. The backplane connector 12 is mounted to the backplane circuit board at the mounting end 42. Other orientations of the interfaces 20, 22 are possible in alternative embodiments.

The daughtercard connector 14 includes a housing 24, made of one or more components, holding a plurality of circuit boards 26 therein. The circuit boards 26 have pairs of individual signal pathways or traces (not shown) that extend between the mating interface 16 and the mounting interface 18. The signal traces have signal conductive pads 32 provided proximate the mating interface 16. The signal conductive pads 32 are configured to be mated with and electrically connected to the signal contacts 48 of the backplane connector 12. The circuit boards 26 have individual ground pathways or traces (not shown) that extend between the mating interface 16 and the mounting interface 18. The ground traces have ground conductive pads 36 provided proximate the mating interface 16. The ground conductive pads 36 are configured to be mated with, and electrically connected to, the ground contacts 50 or the shield or ground plates 52 of the backplane connector 12. The circuit boards 26 also have ground pathways or traces 35 on opposites sides of the circuit boards 26 from the ground traces. The ground traces 35 extend between the mating interface 16 and the mounting interface 18. In alternative embodiments, the circuit boards 26 may be contact modules, the signal traces may be mating signal contacts and the ground traces may be ground contacts.

The backplane connector 12 includes a housing 38 which includes a plurality of modules 40. Each of the modules 40 has a mating end 46, also referred to herein as a front 46, that is loaded into recess 44 of the daughtercard connector 14 during mating. Each of the modules 40 has a mounting end 42, also referred to herein as a rear 42, which is mounted to the backplane circuit board. Each of the modules 40 holds a plurality of individual signal contacts 48 that extend between the mating end 46 and the mounting end 42. In an exemplary embodiment, the signal contacts 48 are arranged in pairs carrying differential signals. Each of the modules 40 holds a plurality of ground contacts 50 that extend between the mating end 46 and the mounting end 42. The ground contacts 50 are electrically connected to shield or ground plates 52 that extend between the mating end 46 and the mounting end 42.

Figure 7:
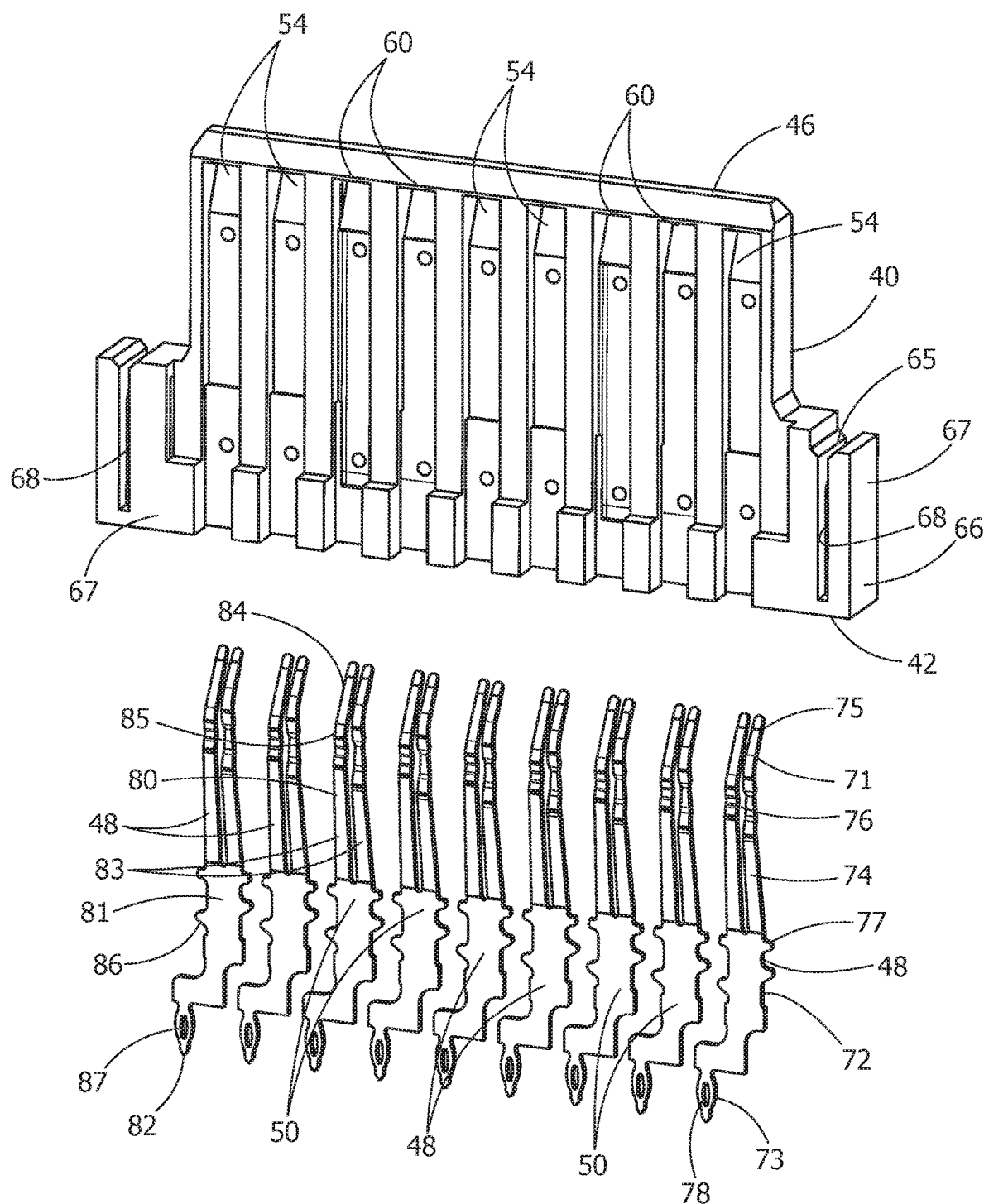
FIG. 7 is an exploded perspective view of a first overmolded chicklet or module of the backplane connector with first contacts exploded therefrom.
Figure 8:
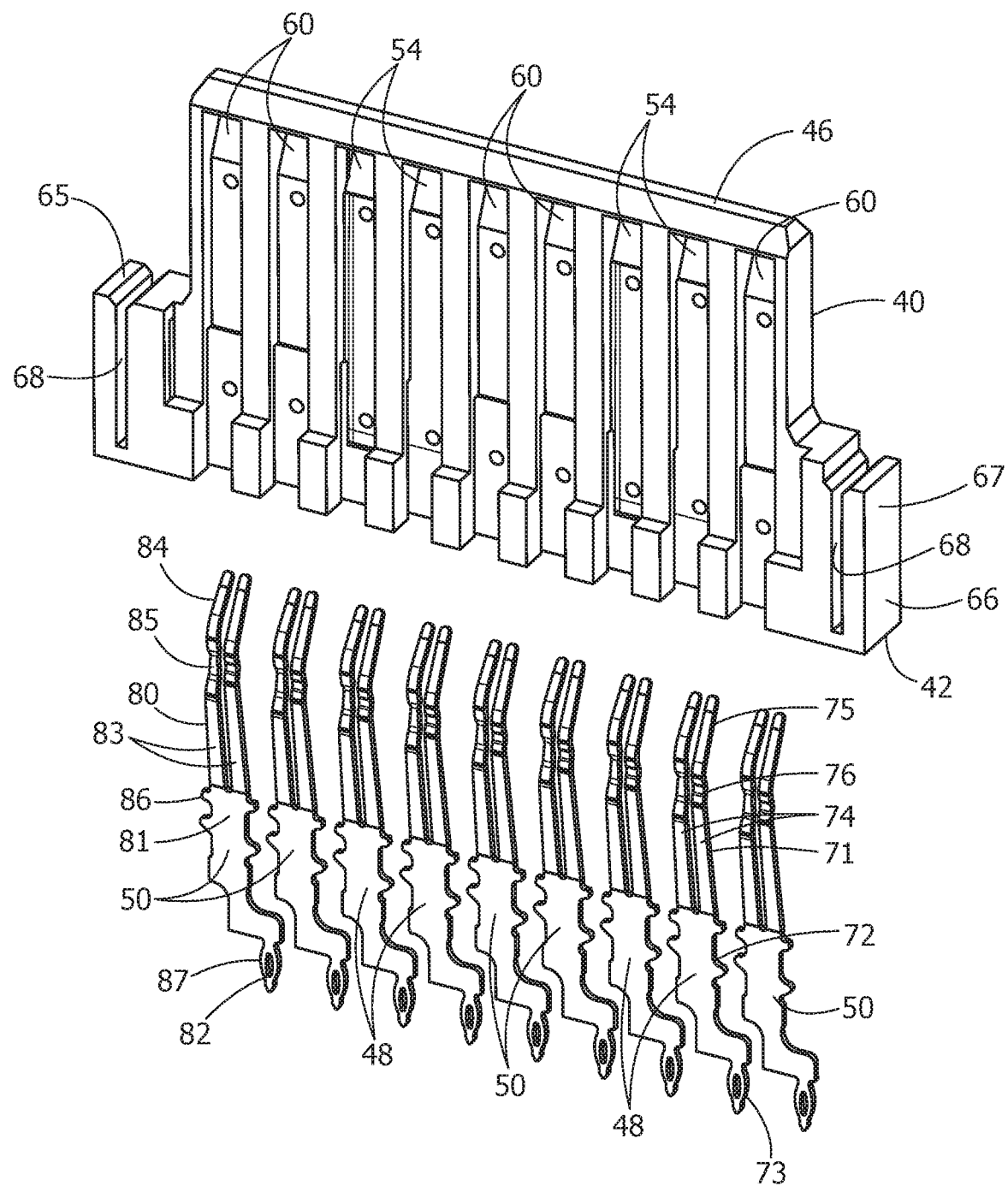
FIG. 8 is an exploded perspective view of a second overmolded chicklet or module of the backplane connector with first contacts exploded therefrom.

As shown in FIGS. 7 and 8, each of the modules 40 include a plurality of signal cavities or channels 54 extending between the mating end 46 and the mounting end 42. The signal channels 54 extend along the mating axes and receive the signal contacts 48. When the backplane connector 12 and daughtercard connector 14 are mated, the signal conductive pads 32 of the mating signal traces of the daughtercard connector 14 are also received in the signal channels 54.

Figure 5:
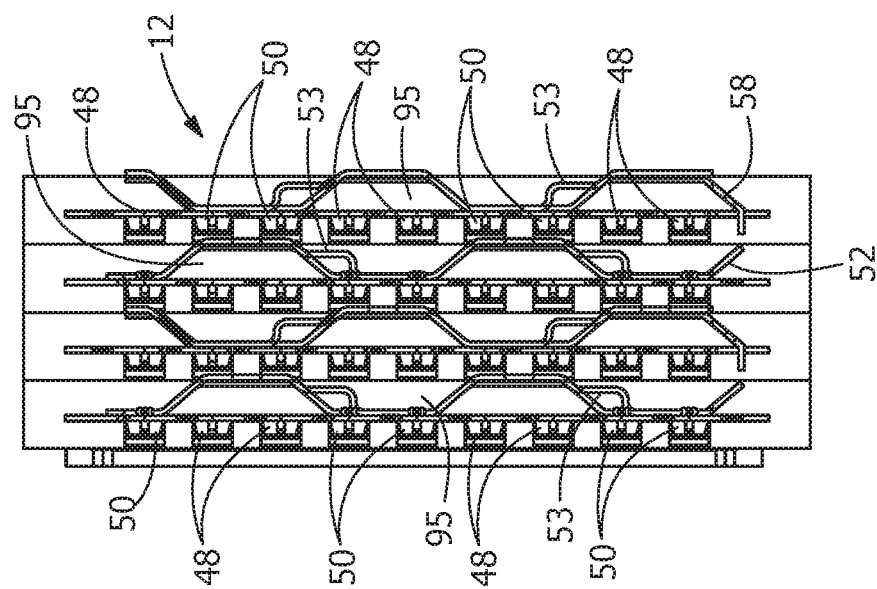
FIG. 5 is a bottom view of the backplane connector.
Figure 4:
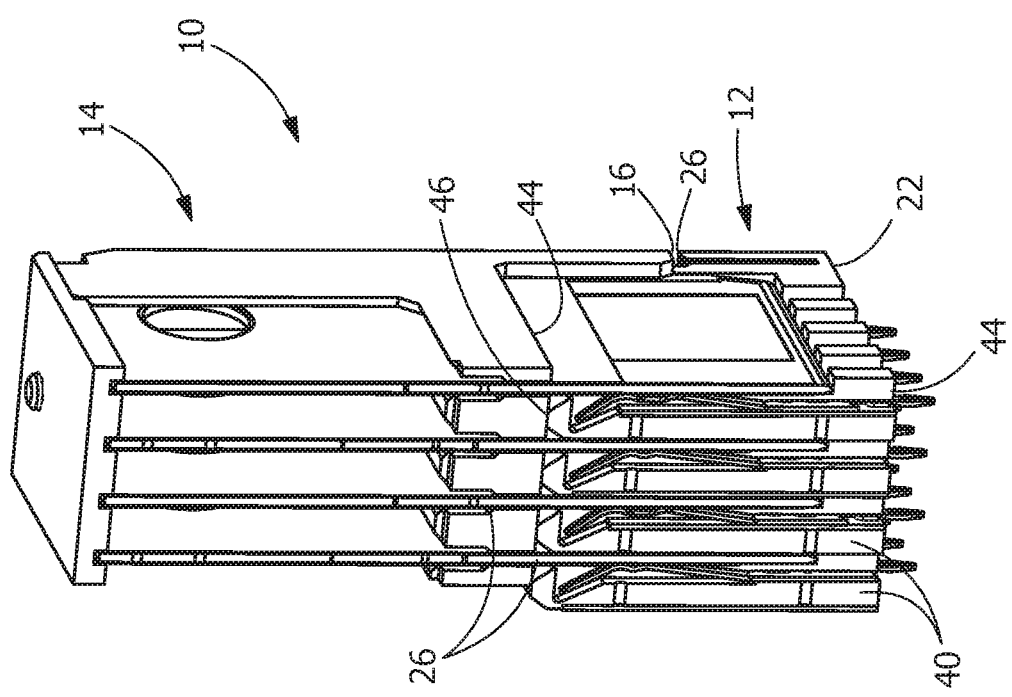
FIG. 4 is a perspective cross-sectional view of the daughtercard connector mated with the backplane connector, taken along line 4-4 of FIG. 3.

As shown in FIG. 5, the modules 40 include slots 58 that receive the shield or ground plates 52. The slots 58 are sized and shaped to receive the shield or ground plates 52. In various embodiments, the modules 40 may be overmolded over the shield or ground plates 52. In such embodiments, the slots 58 are formed during the overmolding process.

As shown in FIGS. 7 and 8, the modules 40 include a plurality of ground cavities or channels 60 extending between the mating end 46 and the mounting end 42. The ground channels 60 are open to the slots 58. The ground channels 60 provide access to the shield or ground plates 52 held in the slots 58. The ground channels 60 extend along the mating axes and receive the ground contacts 50. The slots 58 extend along the mating axes and receive portions of the shield or ground plates 52. When the backplane connector 12 and daughtercard connector 14 are mated, ground conductive pads 36 of the ground traces of the daughtercard connector 14 are also received in the ground channels 60. Any number of ground channels 60 may be provided. The ground channels 60 may be provided at any locations within the modules 40 and the housing 38. In an exemplary embodiment, the ground channels 60 are generally positioned between pairs of signal channels 54, to correspond to positions of the ground contacts 50, the shield or ground plates 52 and the ground conductive pads 36 of the ground traces between pairs of the signal contacts 48 and mating signal traces.

Figure 6:
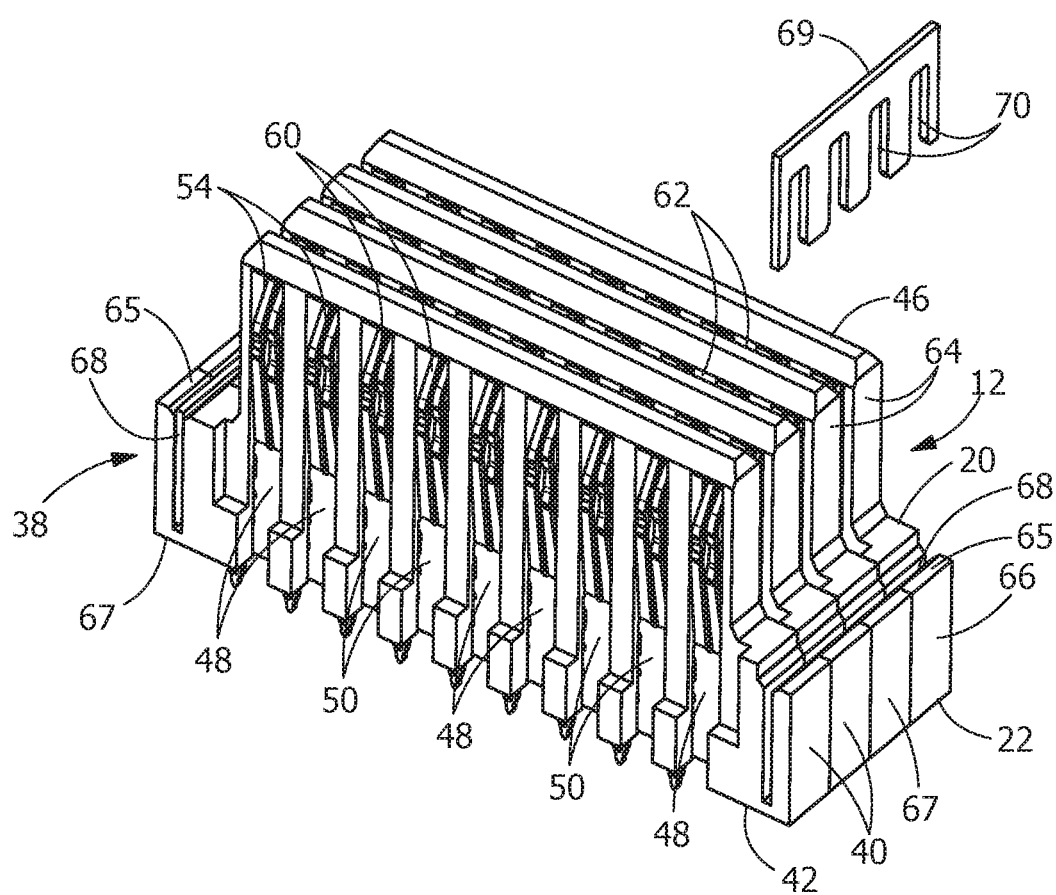
FIG. 6 is a perspective view of the backplane connector with a clip exploded therefrom.

In the illustrative embodiment shown in FIG. 6, the housing 38 of the backplane connector 12 has four modules 40 which are positioned adjacent to each other. However, other number of modules may be provided, such as, but not limited to, 8 modules or 16 modules. Circuit board receiving slots 62 are provided between adjacent modules 40. The circuit board receiving slots 62 are positioned adjacent mating connector receiving sections 64 of the modules 40. Each circuit board receiving slot 62 extends from the mating end 46 of the module toward the mounting end 42.

As shown in FIGS. 6 through 8, each module 40 has a base section 66 which extends from the mounting end 42 toward the mating end 46. The base section 66 has end sections 67 which extend beyond the connector receiving sections 64, as shown in FIG. 5. Each of the end sections 67 has a clip receiving slot 68 which extends from a top surface 65 of the end section 67 toward the mounting end 42. However, other configurations of the clip receiving slot 68 may be used, such as, for example, the clip receiving slot may extend from a bottom surface of the end section 67.

When the modules 40 are properly assembled, as shown in FIG. 6, clips 69 are inserted into the clip receiving slots 68 to properly position and retain the modules 40 in position relative to each other. The clips 69 may have cavities 70 provided therein which cooperate with projections (not shown) in the clip receiving slots 68 to more accurately position and maintain the modules 40 relative to each other.

Referring to FIGS. 7 and 8, the signal channels 54 and ground channels 60 are shown. As previously described, the signal channels 54 are configured to receive the signal contacts 48 therein. Each signal contact 48 has a mating contact receiving section 71, a securing section 72 and circuit board mounting section 73. In the illustrative embodiment shown, the contact receiving section 71 includes two resilient arms 74 with lead in portions 75 and engagement portions 76. The resilient arms 74 are configured to press against the signal conductive pads 32 of the signal traces when the daughter card connector 14 is mated to the backplane connector 12. The securing section 72 has barbs or projections 77 which extend from side surfaces of the securing section 72. The circuit board mounting section 73 has a compliant portion 78, such as an eye of the needle pin, although other configurations may be used. Each of the circuit board mounting section 73 has a longitudinal axis which is offset from the longitudinal axis of the securing section 72 and the mating contact receiving section 71. The signal contacts 48 shown in FIG. 7 have the circuit board mounting section 73 offset to the left, while the signal contacts 48 shown in FIG. 8 have the circuit board mounting section 73 offset to the right. As the mounting section 73 of the signal contacts 48 in one module 40 are offset from the mounting section 73 of the signal contacts 48 in an adjacent module 40, the crosstalk is reduced in the footprint of the backplane connector 12, as the staggered pattern is configured for cancellation.

As previously described, the ground channels 60 are configured to receive the ground contacts 50 therein. Each ground contact 50 has a mating contact receiving section 80, a securing section 81 and circuit board mounting section 82. In the illustrative embodiment shown, the contact receiving section 80 includes two resilient arms 83 with lead in portions 84 and engagement portions 85. The resilient arms 83 are configured to press against the ground conductive pads 36 of the ground traces when the daughter card connector 14 is mated to the backplane connector 12.

The securing section 81 has barbs or projections 86 which extend from side surfaces of the securing section 81. The circuit board mounting section 82 has a compliant portion 87, such as an eye of the needle pin, although other configurations may be used. Each of the circuit board mounting section 82 has a longitudinal axis which is offset from the longitudinal axis of the securing section 81 and the mating contact receiving section 80. The ground contact 50 shown in FIG. 7 have the circuit board mounting section 82 offset to the left, while the ground contact 50 shown in FIG. 8 have the circuit board mounting section 82 offset to the right.

Figure 10:
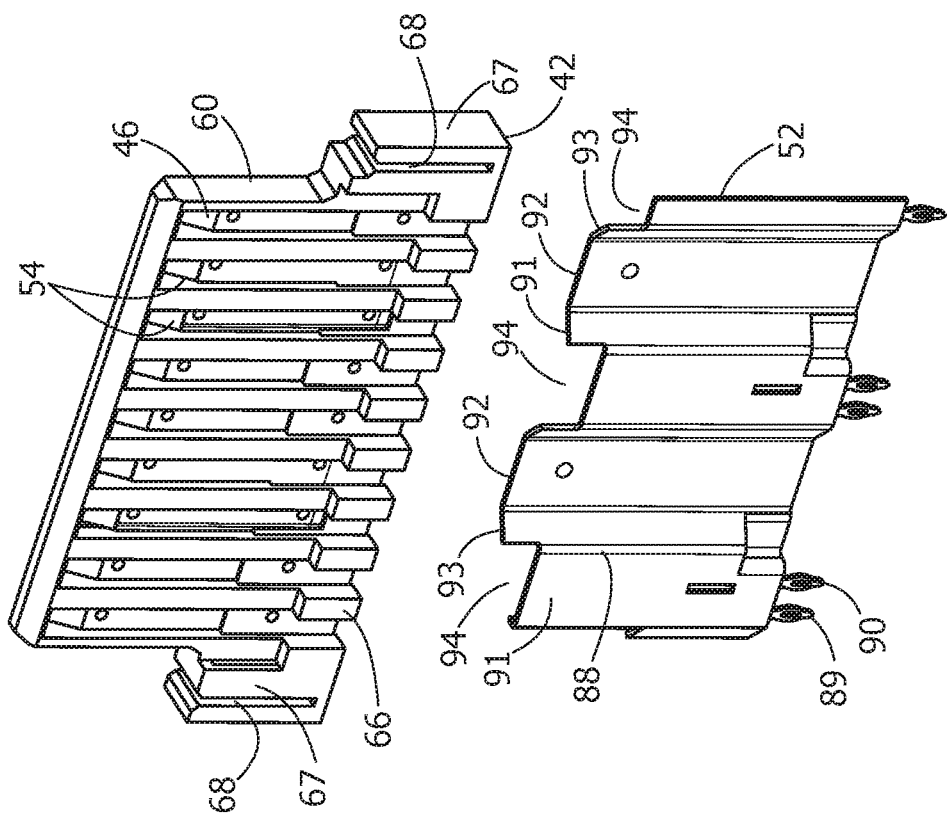
FIG. 10 is a front exploded perspective view the overmolded chicklet or module of FIG. 9 with a shield or ground plate exploded therefrom, the contacts are not shown in this view.
Figure 9:
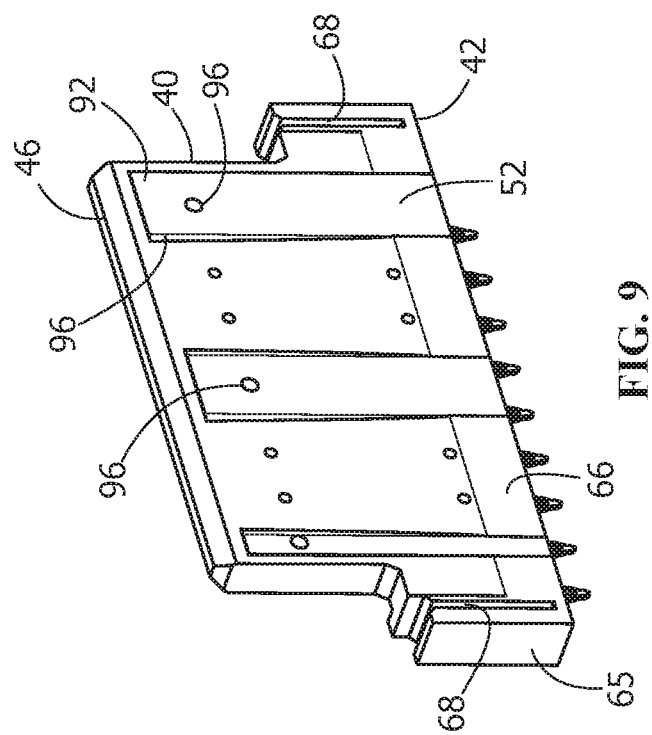
FIG. 9 is a back perspective view of the overmolded chicklet or module of the backplane connector.

As shown in FIGS. 9 and 10, the shield or ground plates 52 have shielding sections 88 and circuit board mounting sections 89. The shield or ground plates 52 are non-planar. In alternate ground plates 52, as shown in FIG. 5, the ground plates 52 may have jogged sections 53 to allow for the ground plates 52 to be properly positioned relative to the signal contact 48 to provide proper shielding to control cross talk, signal radiation or other electrical characteristics.

The circuit board mounting sections 89 have compliant portions 90, such as an eye of the needle pin, although other configurations may be used. The shielding sections 88 of the shield or ground plates 52 have a wavy configuration to pass between and along pairs of signal contacts 48. Optionally, the shielding sections 88 may be located as far from the signal contacts 48 as possible. For example, the shielding sections 88 may be shaped to be positioned generally equidistant from adjacent signal contacts 48.

The shielding sections have first sections 91 and second sections 92 which are positioned in a different plane than the first sections 91. Transition sections 93 extend between the first sections 91 and the second sections 92. In the illustrative embodiment, the transition sections 93 are angled with respect to the first sections 91 and the second sections 92. Alternatively, the transition sections 93 may curved or radiused rather than angled. In the illustrative embodiment shown in FIGS. 8 through 9, the second sections 92 have protrusions or dimples 96 which extend in a direction away from the first sections 91.

FIG. 5 is a bottom view of the backplane connector 12 with the ground plates 52 shown in phantom to illustrate the layout of the signal contacts 48, the ground contacts 50 and shield or ground plates 52. The ground contacts 50 and the shield or ground plates 52 entirely peripherally surround the pairs of signal contacts 48 to provide electrical shielding for the pairs of signal contacts 48. Gaps or spaces, which could allow EMI leakage between pairs of signal contacts 48, are minimized through or between the ground contacts 50 and the shield or ground plates 52.

The shield or ground plates 52 extend along multiple pairs of signal contacts 48. The shield or ground plates 52 engage the ground contacts 50 to electrically common the ground contacts 50 and the shield or ground plates 52 together. The ground contacts 50 and the shield or ground plates 52 form cavities 95 around the pairs of signal contacts 48. The cavities 95 may have any shape depending on the shapes of the ground contacts 50 and the shield or ground plates 52. In the illustrated embodiments, the cavities 95 have a hexagonal prism shape.

With the housing 38 properly assembled, the ground contacts 50 and the shield or ground plates 52 extend about the periphery of the pairs of signal contacts 48 and surround the pairs of signal contacts 48 to provide electrical shielding for the pairs of signal contacts 48. In an exemplary embodiment, entire, 360 degree shielding is provided by the ground contacts 50 and the shield or ground plates 52 along the length of the signal contacts 48. The ground contacts 50 and the shield or ground plates 52 surround portions of the mating signal traces when the connectors 12, 14 are mated. The ground contacts 50 and the shield or ground plates 52 provide shielding along the entire mating interface with the signal conductive pads 32 of the mating signal traces. The ground contacts 50 and the shield or ground plates 52 may control electrical characteristics at the mating interfaces 16, 20 and throughout the housing 38, such as by controlling cross talk, signal radiation, impedance or other electrical characteristics.

With the daughtercard connector 14 properly mated to the backplane connector 12, the circuit boards 26 of the daughter card connector 14 are positioned in the circuit board receiving slots 62 positioned adjacent mating connector receiving sections 64 of the modules 40. In this position, the signal contacts 48 of the modules 40 physically and electrically engage the signal conductive pads 32 of the signal traces of the circuit boards 26. The ground contacts 50 of the modules 40 are also placed in physical and electrical engagement with the ground conductive pads 36 of the ground traces of the circuit boards 26. In addition, the dimples or resilient contact points 96 of the shield or ground plates 52 physically and electrically engage the ground traces 35 of the circuit boards 26.

The ground contacts 50 and the shield or ground plates 52 provide shielding for the signal contacts 48 and the portions of the signal conductive pads 32 of the signal traces of the circuit boards 26 which are positioned in the circuit board receiving slots 62 of the modules 40 of the housing 38 of the backplane connector 12.

Figure 11:
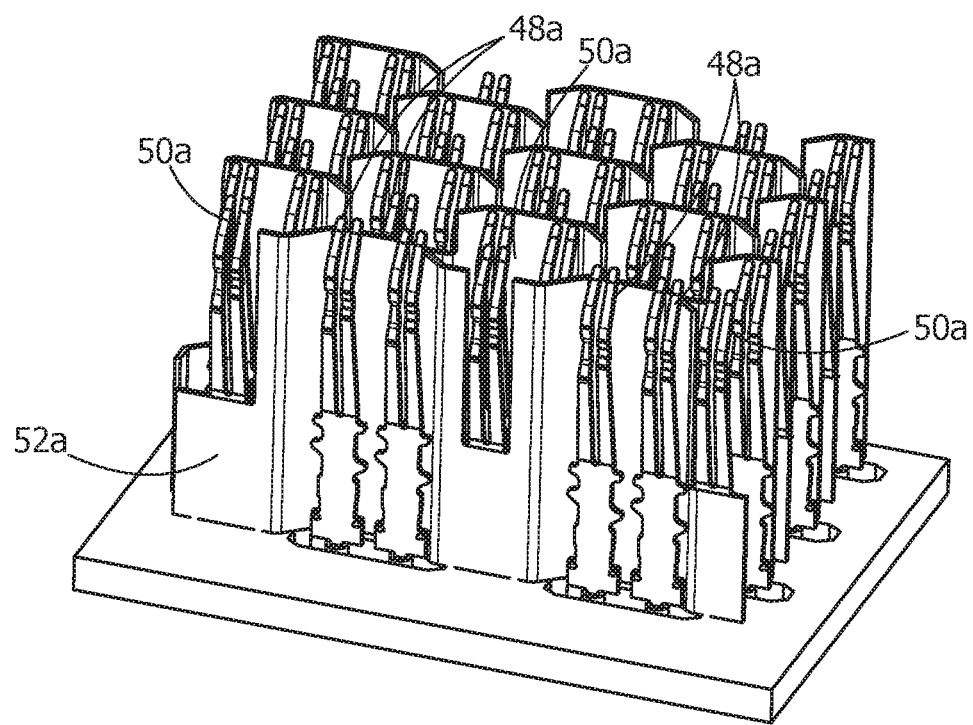
FIG. 11 is perspective view of an alternate illustrative backplane connector of the present invention with the housing removed.
Figure 12:
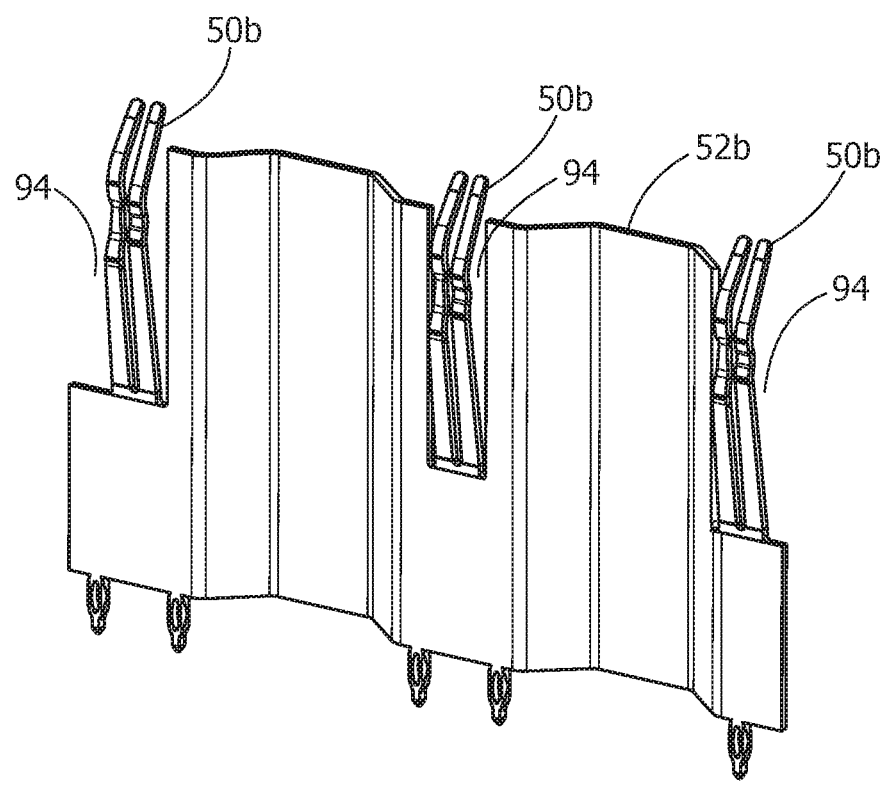
FIG. 12 is a front perspective view of alternate illustrative embodiment of a shield or ground plate of the present invention.
Figure 13:
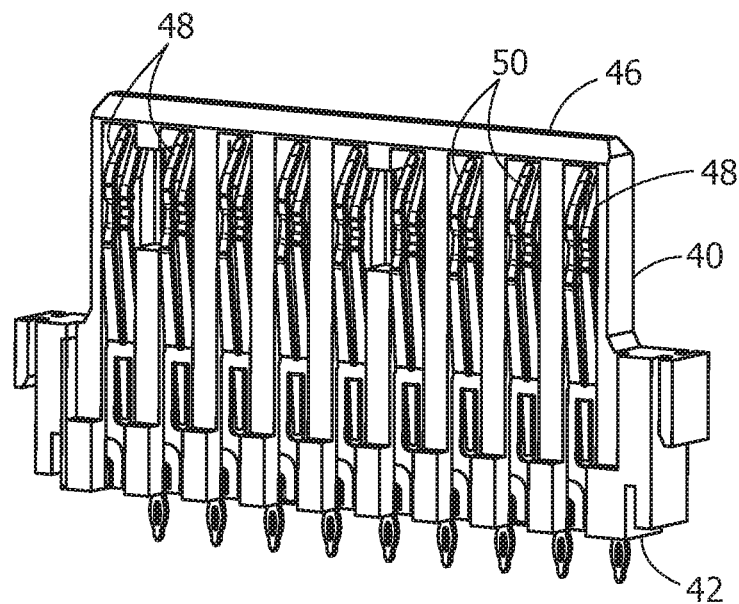
FIG. 13 is a front perspective view of an alternate illustrative chicklet or module of the backplane connector.
Figure 14:
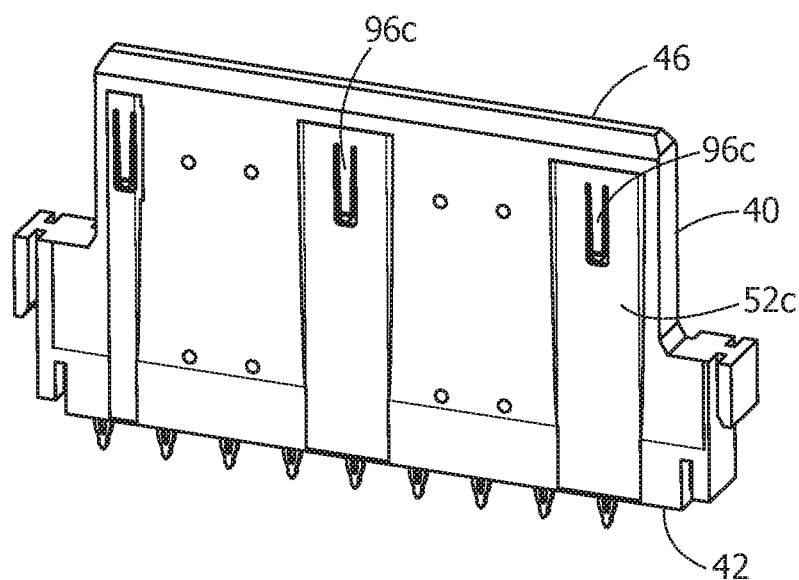
FIG. 14 is a back perspective view of the chicklet or module of FIG. 13.
Figure 15:
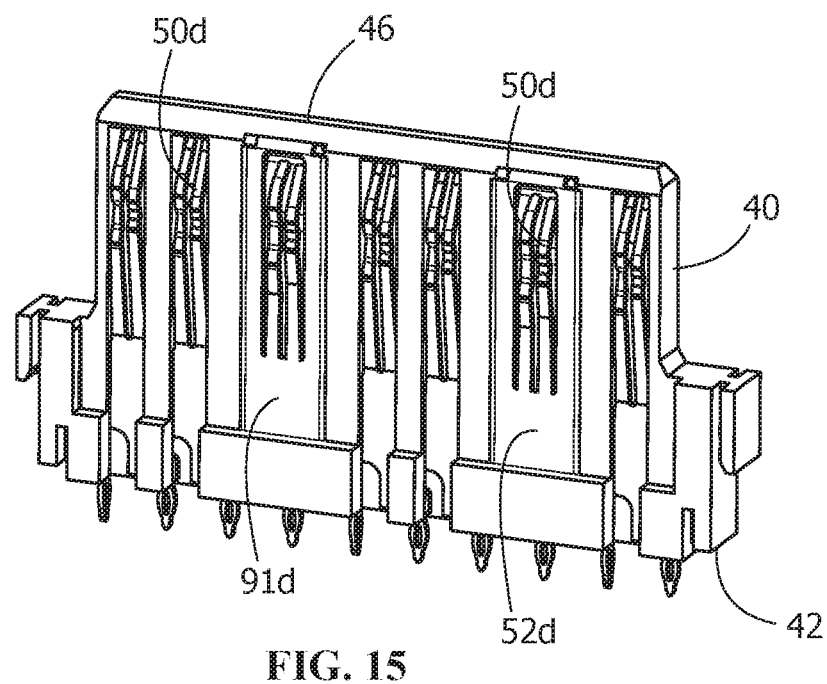
FIG. 15 is a front perspective view of an alternate illustrative chicklet or module of the backplane connector.
Figure 16:
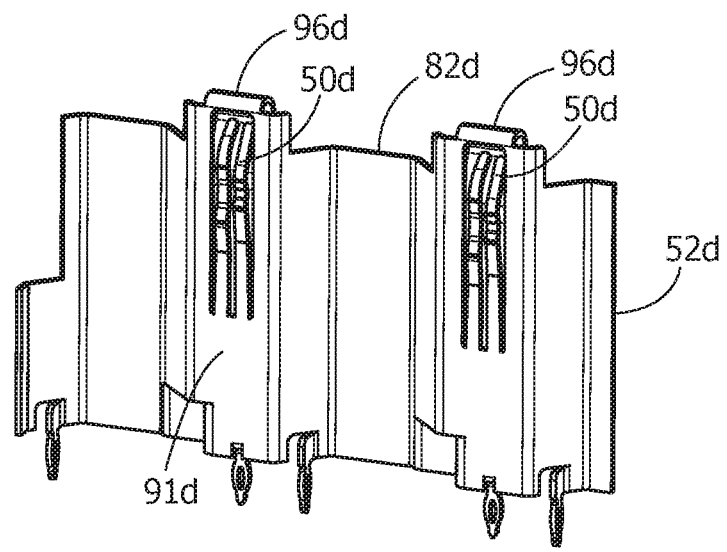
FIG. 16 is a back perspective view of the chicklet or module of FIG. 15.
Figure 17:
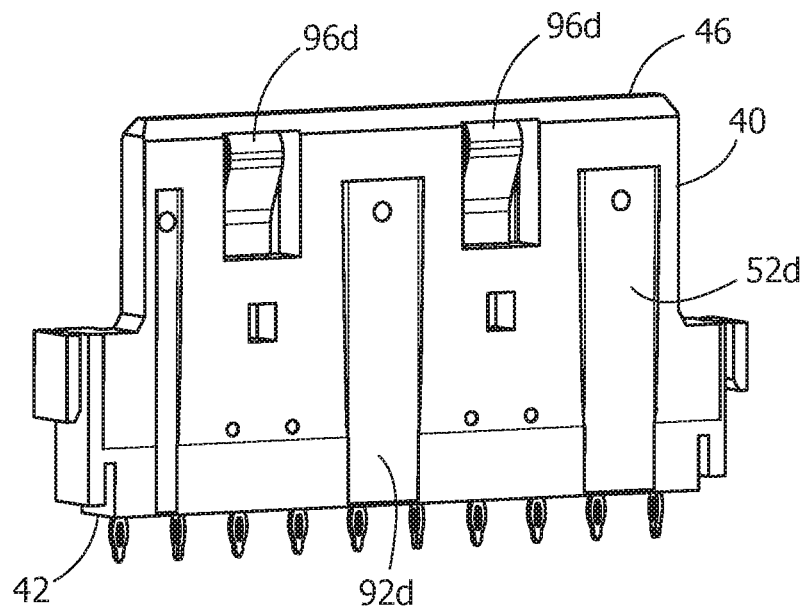
FIG. 17 is a front perspective of the shield or ground plate of FIG. 15.
Figure 18:
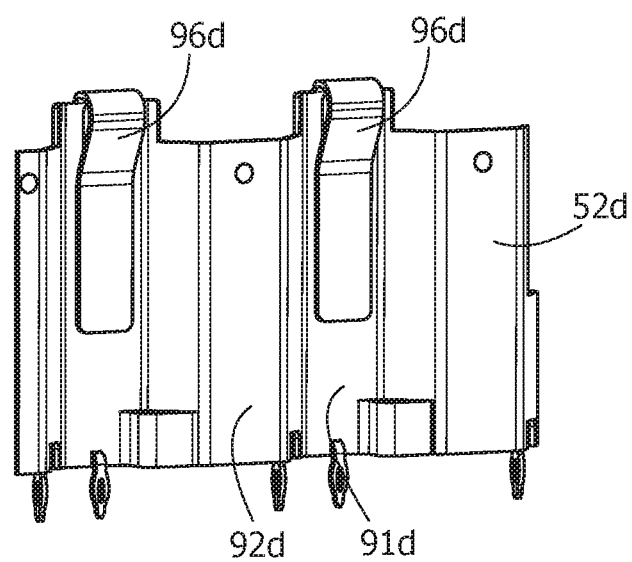
FIG. 18 is a back perspective of the shield or ground plate of FIG. 15.

FIGS. 11 through 18 show alternate illustrative embodiments of the ground contacts 50 and the shield or ground plates 52. FIG. 11 illustrates an alternate embodiment of the signal contacts 48a, ground contacts 50a and shield or ground plate 52a with the housing removed. FIG. 12 illustrates an embodiment in which ground contacts 50b are integrally formed with a shield or ground plate 52b. The ground contacts 50b are positioned in receiving slots 94. FIGS. 13 and 14 illustrate an embodiment in which a shield or ground plate 52c has resilient contact arms 96c which extend in a direction away from the first sections 91c. The resilient contact arms 96c are configured to physically and electrically engage the ground traces 35 of the circuit boards 26. FIGS. 15 through 18 illustrate an embodiment in which ground contact 50d are integrally formed with a shield or ground plate 52d. A shield or ground plate 52d has contact arms 96d which are bent from first section 91d and extend in a direction toward the second sections 92d, but extend from the first sections 91d further than the second sections 92d. The contact arms 96d are provided to properly position the circuit boards 26 and close the gaps around the ground contacts.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An electrical connector for use in an electrical connector system which controls cross talk and signal radiation, the electrical connector comprising:
   a housing having a plurality of modules, the modules having mating ends and mounting ends;
   signal contacts positioned in the modules, the signal contacts extending between the mating ends and the mounting ends, the signal contacts being arranged in pairs to carry differential signals;
   ground contacts positioned in the modules, the ground contacts extending between the mating ends and the mounting ends, respective ground contacts of the ground contacts being positioned adjacent to respective signal contacts of the signal contacts;
   ground plates positioned in the modules, the ground plates extending between the mating ends and the mounting ends, the ground contacts being electrically connected to the ground plates.

2. The electrical connector as recited in claim 1, wherein the signal contacts have mating contact receiving sections, securing sections and circuit board mounting sections, the circuit board mounting sections are offset from the mating contact receiving sections, the circuit board mounting sections of the signal contacts in a respective module of the modules are offset from the circuit board mounting sections of the signal contacts in a respective adjacent module of the modules wherein the crosstalk is reduced in the footprint of the signal contacts, as the offset pattern the circuit board mounting sections of the signal contacts is configured for cancellation.

3. The electrical connector as recited in claim 1, wherein the modules have signal cavities which extend between the mating ends and the mounting ends, the signal cavities extend along a mating axes of the connector and receive the signal contacts therein.

4. The electrical connector as recited in claim 3, wherein the modules have ground slots, the ground slots extend along the mating axes and receive the ground plates therein.

5. The electrical connector as recited in claim 4, wherein the modules have ground cavities which extend between the mating ends and the mounting ends, the ground cavities extend along the mating axes and receive the ground contacts therein, the ground cavities are open to the slots.

6. The electrical connector as recited in claim 5, wherein the modules are overmolded over the ground plates, wherein the ground slots are formed during the overmolding process.

7. The electrical connector as recited in claim 4, wherein circuit board receiving slots are provided between adjacent modules, the circuit board receiving slots are positioned adjacent mating connector receiving sections of the modules, the circuit board receiving slots extend from the mating ends of the modules toward the mounting ends.

8. The electrical connector as recited in claim 7, wherein the modules have base sections which extend from the mounting ends toward the mating ends, the base sections have end sections which extend beyond the connector receiving sections, the end sections have clip receiving slots.

9. The electrical connector as recited in claim 8, wherein clips are inserted into the clip receiving slots to properly position and retain the modules in position relative to each other.

10. The electrical connector as recited in claim 7, wherein the ground contacts and the ground plates extend about the periphery of the pairs of signal contacts and surround the pairs of signal contacts to provide electrical shielding for the pairs of signal contacts.

11. The electrical connector as recited in claim 10, wherein the ground plates have shielding sections and circuit board mounting sections, the ground plates have jogged sections to allow for the ground plates to be properly positioned relative to the signal contact to provide proper shielding to control cross talk without adversely affecting the impedance of pairs of signal contacts.

12. The electrical connector as recited in claim 10, wherein the shielding sections of the ground plates have wavy configurations to pass between and along the pairs of the signal contacts.

13. The electrical connector as recited in claim 12, wherein the shielding sections are shaped to be positioned generally equidistant from adjacent signal contacts.

14. The electrical connector as recited in claim 12, wherein the shielding sections have first sections and second sections, the second sections being positioned in a different plane than the first sections, transition sections extend between the first sections and the second sections.

15. The electrical connector as recited in claim 14, wherein ground contact receiving slots are provided in the first sections.

16. The electrical connector as recited in claim 15, wherein the second sections have protrusions which extend in a direction away from the first sections.

17. The electrical connector as recited in claim 10, wherein respective ground contact are integrally formed with the ground plate.

18. The electrical connector as recited in claim 10, wherein the ground plates have resilient contact arms which extend in a direction away from the first sections, the resilient contact arms are configured to physically and electrically engage ground traces of circuit boards which are positioned in the circuit board receiving slots.

19. The electrical connector as recited in claim 10, wherein the ground plate has contact arms which are bent from first section and extend in a direction toward the second sections.

20. An electrical connector for use in an electrical connector system which controls cross talk and signal radiation, the electrical connector comprising:
  a housing having a plurality of modules, the modules having mating ends and mounting ends;
  signal contacts positioned in the modules, the signal contacts extending between the mating ends and the mounting ends, the signal contacts being arranged in pairs to carry differential signals, circuit board mounting sections of the signal contacts are offset from the mating contact receiving sections of the signal contacts, the circuit board mounting sections in a respective module of the modules being offset from the circuit board mounting sections in a respective adjacent module of the modules;
  ground contacts positioned in the modules, the ground contacts extending between the mating ends and the mounting ends, respective ground contacts of the ground contacts positioned adjacent to respective signal contacts of the signal contacts;
  ground plates positioned in the modules, the ground plates extending between the mating ends and the mounting ends, the ground contacts being electrically connected to the ground plates, the ground plates having jogged sections to properly position the ground plates relative to the signal contact, the ground plates having wavy configurations to pass between and along the pairs of the signal contacts, the ground plates having first sections and second sections, the second sections being positioned in a different plane than the first sections, the second sections having protrusions which extend in a direction away from the first sections, the modules being overmolded over the ground plates.

* * * * *